(12) United States Patent
Ngo et al.

(10) Patent No.: US 6,686,232 B1
(45) Date of Patent: Feb. 3, 2004

(54) ULTRA LOW DEPOSITION RATE PECVD SILICON NITRIDE

(75) Inventors: Minh Van Ngo, Fremont, CA (US); Robert A. Huertas, Hollister, CA (US); Dawn Hopper, San Jose, CA (US); Hieu Pham, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/173,717

(22) Filed: Jun. 19, 2002

(51) Int. Cl.[7] ............................................. H01L 21/471
(52) U.S. Cl. ........................ 438/197; 438/763; 438/787; 438/792
(58) Field of Search ................................ 438/197, 763, 438/787, 788, 791, 792

(56) References Cited

U.S. PATENT DOCUMENTS

| | | | |
|---|---|---|---|
| 5,731,243 A | * | 3/1998 | Peng et al. ................. 438/612 |
| 5,986,329 A | | 11/1999 | Ngo |
| 6,080,682 A | * | 6/2000 | Ibok ............................ 438/770 |
| 6,150,286 A | * | 11/2000 | Sun et al. .................... 438/791 |
| 6,156,598 A | * | 12/2000 | Zhou et al. .................. 438/231 |
| 6,207,586 B1 | * | 3/2001 | Ma et al. ..................... 438/763 |
| 6,221,793 B1 | | 4/2001 | Ngo et al. |
| 6,235,654 B1 | | 5/2001 | Ngo et al. |
| 6,242,367 B1 | | 6/2001 | Sun et al. |
| 6,399,520 B1 | * | 6/2002 | Kawakami et al. ......... 438/778 |
| 2003/0132510 A1 | * | 7/2003 | Barth et al. ................. 257/637 |

* cited by examiner

Primary Examiner—Carl Whitehead, Jr.
Assistant Examiner—Stephen W. Smoot

(57) ABSTRACT

A thin silicon nitride layer is deposited at an ultra low deposition rate by PECVD by reducing the $NH_3$ flow rate and/or reducing the $SiH_4$ flow rate. Embodiments include depositing a thin layer of silicon nitride, e.g., 100 Å or less, on a thin silicon oxide liner over a gate electrode, at an $NH_3$ flow rate of 100 to 800 sccm, a $SiH_4$ flow rate of 50 to 100 sccm and a reduced pressure of 0.8 to 1.8 Torr. Embodiments of the present invention further include depositing the silicon nitride layer in multiple deposition stages, e.g., depositing the silicon nitride layer in five deposition stages of 20 Å each.

19 Claims, 2 Drawing Sheets

ULTRA LOW DEPOSITION RATE PECVD SILICON NITRIDE

FIELD OF THE INVENTION

The present invention relates to an efficient method of fabricating semiconductor devices exhibiting high reliability with excellent uniformity and repeatability. The present invention has particular applicability in manufacturing high density, multi-level semiconductor devices with feature dimensions in the deep sub-micron regime.

BACKGROUND OF THE INVENTION

Silicon nitride deposition is employed extensively in various stages and in various aspects of semiconductor device fabrication. For example, a silicon nitride spacer is typically formed on side surfaces of a gate electrode during front end of the line (FEOL) processing, typically subsequent to ion implantation to form source/drain extension implants. Subsequent to silicon nitride spacer formation, a second dopant implantation is typically conducted to form moderately or heavily doped source/drain implants. The nitride spacers prevent dopants during the source/drain ion implantation from reaching the source/drain extensions, thereby maintaining the integrity of the lightly doped extensions.

As in other aspects of semiconductor fabrication, as the dimensions shrink into the deep sub-micron range, as in forming devices with a design rule of about 0.13 micron and under, it becomes necessary to reduce the thickness of the oxide liner and nitride sidewall spacers. However, as the thickness of such layers, typically deposited by plasma enhanced chemical vapor deposition (PECVD) decreases, it becomes increasingly difficult to obtain better process control, uniform thickness and high repeatability.

Accordingly, there exists a need for efficient methodology enabling the deposition of a layer silicon nitride at a reduced thickness with high quality, high uniformity and high repeatability.

SUMMARY OF THE INVENTION

An advantage of the present invention is a method of manufacturing a semiconductor device comprising depositing a silicon nitride layer at a low deposition rate with improved process control, high quality, high thickness uniformity within wafer and wafer-to-wafer, and excellent repeatability.

According to the present invention, the foregoing and other advantages are achieved, in part, by a method of manufacturing a semiconductor device, the method comprising depositing a layer of silicon nitride at a thickness of 100 Å or less by plasma enhanced chemical vapor deposition (PECVD) employing an ammonia ($NH_3$) flow rate of 400 to 1200 sccm.

Embodiments of the present invention comprise depositing a silicon nitride layer at a silane ($SiH_4$) flow rate of 50 to 100 sccm, a nitrogen ($N_2$) flow rate of 2000 to 6000 sccm, a pressure of 0.8 to 1.8 Torr and an RF power of 200 to 600 watts, at an ultra low deposition rate of 400 to 600 Å/minute. Embodiments of the present invention include depositing the silicon nitride layer over an oxide layer formed on a gate electrode over a substrate with a gate dielectric layer therebetween, and etching to form a silicon oxide liner on side surfaces of the gate electrode and a silicon nitride liner/spacer on the silicon oxide liner. Embodiments of the present invention further include depositing the oxide liner layer at a thickness of 50 Å or less, and depositing the nitride spacer layer at a thickness of 100 Å or less, and in a plurality of deposition stages.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature and not as restrictive.

BRIEF DESCRIPTION OF THE DRAWINGS

In FIGS. 1 through 5, similar features are denoted by similar reference characters.

DETAILED DESCRIPTION OF THE INVENTION

Figure 1:
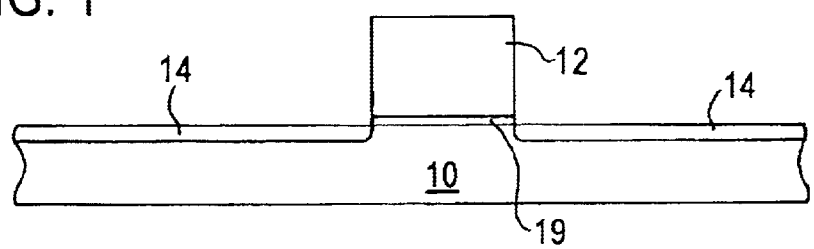
FIGS. 1 through 5 schematically illustrate sequential phases of a method in accordance with an embodiment of the present invention.

As semiconductor device dimensions shrink into the deep sub-micron regime, it becomes increasingly difficult to deposit silicon nitride layers, as by PECVD, of high quality, uniform thickness, both within wafer and wafer-to-wafer, high repeatability and good step coverage. The present invention addresses and solves such problems by strategically manipulating certain PECVD conditions to achieve an ultra low deposition rate, such as a silicon nitride deposition rate of about 400 to about 600 Å/minute, resulting in silicon nitride layers of high quality, good step coverage, and excellent uniformity and repeatability. In accordance with embodiments of the present invention, silicon nitride is deposited by strategically reducing the flow rate of $NH_3$ and/or $SiH_4$ as well as reducing the pressure. By these strategic reductions in the flow rate of $NH_3$ and $SiH_4$, and by reducing the pressure, a lower deposition rate is achieved by increasing the mean free path of the reactants, thereby increasing conformability and thickness uniformity. Moreover, it was found that the deposited silicon nitride layer exhibits reduced hydrogen, thereby avoiding undesirable data retention, hot carry injection and metal embrittlement issues.

Embodiments of the present invention include depositing a layer of silicon nitride by PECVD at a reduced $NH_3$ flow rate of 100 to 800 sccm, a reduced $SiH_4$ flow rate of 50 to 100 sccm, a reduced pressure of 0.8 to 1.8 Torr, e.g., 1.5 Torr, a $N_2$ flow rate of about 2000 to about 6000 sccm, and an RF power of about 200 to about 600 watts, e.g., about 300 watts without applying any bias power. The distance between the wafer and shower head through which the reactant gases exit, i.e., spacing, can be maintained at about 0.45 to about 0.60 inches.

Advantageously, in accordance with embodiments of the present invention, an ultra thin layer of a silicon nitride is deposited, such as at a thickness of about 100 Å or less, exhibiting reduced hydrogen, high quality, high uniformity and excellent conformability. In other embodiments of the present invention, the nitride liner is deposited in a plurality of stages, thereby advantageously reducing pinholes and improving the density of the silicon nitride film. For example, it was found advantageous to deposit a silicon nitride film having a total thickness of about 100 Å or less in five deposition stages, each deposition stage conducted at the low deposition rate of about 400 to about 600 Å/minute to form a sub-layer having a thickness of about 20 Å or less.

In other embodiments of the present invention, the silicon nitride layer is deposited over an oxide layer, such as a silicon oxide layer having a thickness of about 50 Å or less, formed on an upper surface and side surfaces of a gate electrode. Etching is then conducted to form a silicon oxide liner on the side surfaces of the gate electrode and a silicon nitride liner or spacer on the silicon oxide liner. Advantageously, the silicon oxide layer and silicon nitride layer can be deposited in the same deposition chamber, in situ, thereby further reducing cycle time, and reducing defects, particularly defects arising as a result of wafer handling, thereby significantly increasing manufacturing throughput and reducing manufacturing costs.

Embodiments of the present invention also include initially heat soaking the wafer for at least 60 second before initiating deposition. Embodiments of the present invention further include employing a sub-100 sccm mass flow controller for regulating $SiH_4$ introduction during sub-layer depositions for better process control.

Figure 2:
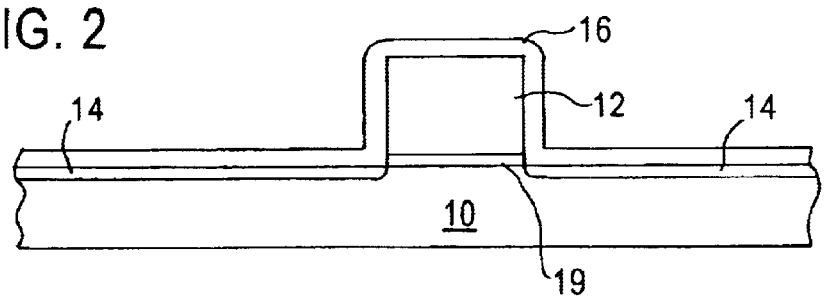

An embodiment of the present invention is schematically illustrated in FIGS. 1 through 5. Adverting to FIG. 1, a gate electrode 12 is formed over a semiconductor substrate 10 with a gate dielectric layer 19 therebetween. Ion implantation is then conducted to form shallow source/drain extensions 14. A thin oxide layer 16, such as silicon oxide at a thickness of about 50 Å or less, is then deposited over the wafer as illustrated in FIG. 2.

Figure 3:
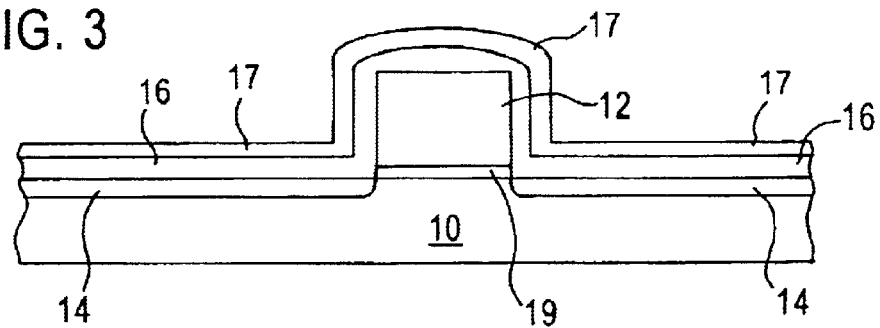

Subsequently, as schematically illustrated in FIG. 3, silicon nitride layer 17 is deposited by PECVD, in accordance with embodiments of the present invention, at a low deposition rate, such as about 400 to about 600 Å/minute, employing reduced $NH_3$ and $SiH_4$ flow rates and a reduced pressure. Advantageously, silicon nitride layer 17 deposited in accordance with embodiments of the present invention exhibits high thickness uniformity, reduced hydrogen and high conformability. Further, silicon nitride layer 17 can be deposited in a plurality of stages, thereby further improving the quality of the silicon nitride layer by reducing pinholes and increasing density.

Figure 4:
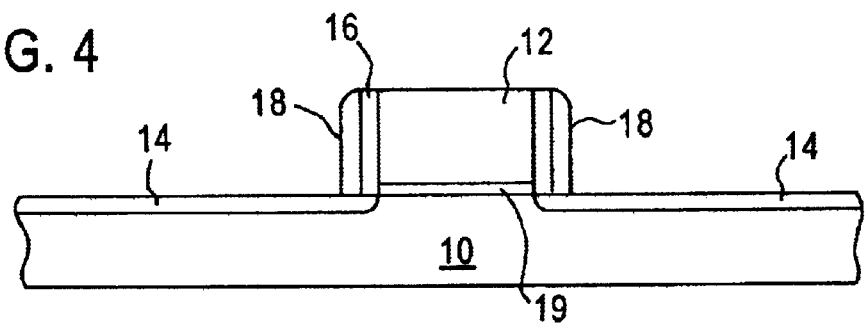
Figure 5:
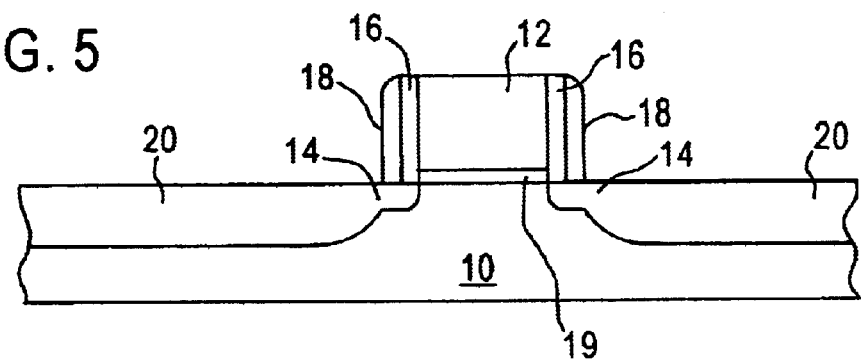

As illustrated in FIG. 4, etching is then conducted to form silicon oxide liner 16 on side surfaces of gate electrode 12 and silicon nitride liner 18 on the silicon oxide liner 16. Subsequently, as illustrated in FIG. 5, ion implantation is conducted to form moderately or heavily doped source/drain implants, followed by annealing to form source/drain regions 20.

The oxide layer 16 deposited in accordance with the present invention can be advantageously deposited at a reduced deposition rate by PECVD at a spacing of about 0.45 to about 0.60 inches employing a $SiH_4$ flow rate of about 20 to about 60 sccm, a $N_2$ flow rate of about 2000 to about 3000 sccm, a nitrous oxide ($N_2O$) flow rate of about 7000 to about 9000 sccm, an RF power of about 150 to about 400 watts, a pressure of about 0.5 to about 1.0 Torr, and a temperature of about 370° C. to about 430° C., for about 0.8 to about 2 seconds. Advantageously, the silicon oxide layer 16 can also be deposited in a plurality of deposition stages. For example, a silicon oxide layer of about 50 Å or less can be deposited in five deposition stages, each conducted at a low deposition rate of about 440 to about 640 Å/minute to deposit silicon oxide sub-layers, each at a thickness of about 6 Å to about 10 Å.

Figure 6:
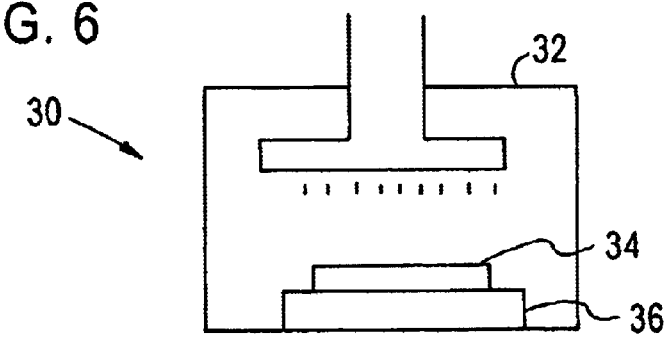
FIG. 6 schematically illustrates a PECVD chamber suitable for implementing an embodiment of the present invention.

Advantageously, the silicon oxide layer and silicon nitride layer can be deposited in the same deposition chamber 30 such as that is illustrated in FIG. 6, comprising chamber 32 in which wafer 34 is positioned on susceptor 36. A suitable device in which to practive embodiments of the present invention is a PRODUCER® deposition chamber manufactured by Applied Materials, Inc. of Santa Clara, Calif.

The present invention advantageously provides efficient methodology for the deposition of ultra thin layers of silicon nitride by PECVD, as at a thickness of about 100 Å or less, with high quality, high density, good step coverage, reduced pinholes, reduced hydrogen, high conformability and high thickness uniformity both within wafer and wafer-to-wafer, with high reproducability. The silicon nitride layer deposited in accordance with embodiments of the present invention is not confined to the sidewall spacers. Rather, silicon nitride is ubiguirously employed during various stages of the semiconductor device fabrication, such as etch stop layers and passivation layers.

The present invention enjoys industrial utility in the fabrication of any various types of semiconductor devices. The present invention enjoys particular industrial applicability in the fabrication of high integrated semiconductor devices exhibiting a design rule of 0.13 micron and under.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are accordingly to be regarded as illustrative and not as restrictive. It is understood that the present invention is capable of using various other combinations and environments, and is capable of changes or modifications within the scope of the inventive concept as expressed herein.

What is claimed is:

1. A method of manufacturing a semiconductor device, the method comprising depositing a layer of silicon nitride, at a deposition rate of 400 to 600 Å/minute, with a thickness of 100 Å or less by plasma enhanced chemical vapor deposition (PECVD) employing an ammonia ($NH_3$) flow rate of 100 to 800 sccm and a silane ($SiH_4$) flow rate of 50 to 100 sccm.

2. The method according to claim 1, comprising depositing the silicon nitride layer at a pressure of 0.8 to 1.8 Torr.

3. The method according to claim 2, comprising depositing the silicon nitride layer at a nitrogen ($N_2$) flow rate of 2000 to 6000 sccm and an RF power of 200 to 600 watts.

4. The method according to claim 1, comprising:
    forming a gate electrode, having an upper surface and side surfaces, over a substrate with a gate dielectric layer therebetween;
    depositing a silicon oxide layer on the upper surface and side surfaces of the gate electrode;
    depositing the silicon nitride layer over the silicon oxide layer; and
    etching to form a silicon oxide liner on the side surfaces of the gate electrode and a silicon nitride liner on the oxide liner.

5. The method according to claim 4, comprising depositing the silicon oxide layer and the silicon nitride layer in situ in the same deposition chamber.

6. The method according to claim 4, comprising:
depositing the silicon oxide liner at a thickness of 50 Å or less; and
depositing the silicon nitride liner at a thickness of 100 Å or less.

7. The method according to claim 6, comprising depositing the silicon nitride layer in a plurality of deposition stages.

8. The method according to claim 7, comprising depositing the silicon oxide layer in a plurality of deposition stages.

9. The method according to claim 6, comprising the silicon nitride layer at a silane ($SiH_4$) flow rate of 50 to 100 sccm.

10. The method according to claim 9, comprising depositing the silicon nitride layer at a pressure of 0.8 to 1.8 Torr.

11. The method according to claim 10, comprising depositing the silicon nitride layer at a nitrogen ($N_2$) flow rate of 2000 to 6000 sccm and an RF power of 200 to 600 watts.

12. A method of manufacturing a semiconductor device, the method comprising depositing a layer of silicon nitride in a plurality of deposition stages, with a thickness of 100 Å or less, by plasma enhanced chemcial vapor deposition (PECVD) employing an ammonia ($NH_3$) flow rate of 100 to 800 sccm and a silane($SiH_4$) flow rate of 50 to 100 sccm.

13. The method according to claim 12, comprising depositing the silicon nitride layer at a thickness of 100 Å or less in five deposition stages, each deposition stage comprising depositing a sub-layer of silicon nitride at a thickness of about 20 Å or less.

14. A method of manufacturing a semiconductor device, the method comprising a depositing a layer of silicon nitride over a substrate in a plurality of plasma enhanced chemical vapor deposition (PECVD) stages, each deposition stage at a deposition rate of 400 to 600 Å/minute.

15. The method according to claim 14, comprising depositing the silicon nitride layer at a thickness 100 Å or less.

16. The method according to claim 15, comprising depositing the silicon nitride layer in five deposition stages, each deposition stage depositing a sub-layer of silicon nitride having a thickness of 20 Å or less.

17. The method according to claim 14, comprising:
forming a gate electrode, having an upper surface and side surfaces over a substrate with a gate dielectric layer therebetween;
depositing a silicon oxide layer on the upper surface and side surfaces of the gate electrode;
depositing the silicon nitride layer over the silicon oxide layer; and
etching to form a silicon oxide liner on the side surfaces of the gate electrode and silicon nitride liner on the silicon oxide liner.

18. A method of manufacturing a semiconductor device, comprising:
forming a gate electrode, having an upper surface and side surfaces, over a substrate with a gate dielectric layer therebetween;
depositing a silicon oxide layer on the upper surface and side surfaces of the gate electrode;
depositing a silicon nitride layer, with a thickness of 100 Å or less, by plasma enhanced chemical vapor deposition (PECVD), in a plurality of PECVD stages, employing an ammonia ($NH_3$) flow rate of 100 to 800 sccm, over the silicon oxide layer; and
etching to form a silicon oxide liner on the side surfaces of the gate electrode and a silicon nitride liner on the oxide liner.

19. The method according to claim 18, comprising depositing the silicon nitride layer in five PECVD stages, each deposition stage comprising depositing a sub-layer of silicon nitride having a thickness of 20 Å or less.

* * * * *